(12) United States Patent
Sears et al.

(10) Patent No.: US 9,653,257 B2
(45) Date of Patent: May 16, 2017

(54) METHOD AND SYSTEM FOR REDUCING CHARGING ARTIFACTS IN SCANNING ELECTRON MICROSCOPY IMAGES

(71) Applicant: KLA-Tencor Corporation, Milpitas, CA (US)

(72) Inventors: Christopher Sears, Fremont, CA (US); Ben Clarke, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/058,062

(22) Filed: Mar. 1, 2016

(65) Prior Publication Data

US 2016/0260576 A1    Sep. 8, 2016

Related U.S. Application Data

(60) Provisional application No. 62/127,599, filed on Mar. 3, 2015.

(51) Int. Cl.
*H01J 37/28* (2006.01)
*H01J 37/26* (2006.01)

(52) U.S. Cl.
CPC ............ *H01J 37/28* (2013.01); *H01J 37/265* (2013.01); *H01J 2237/004* (2013.01); *H01J 2237/153* (2013.01); *H01J 2237/226* (2013.01)

(58) Field of Classification Search
USPC ........................................ 250/310, 306, 307
See application file for complete search history.

(56) References Cited

U.S. PATENT DOCUMENTS 7,601,953 B2 * 10/2009 Ward ...................... H01J 37/08
250/309

* cited by examiner

*Primary Examiner* — Kiet T Nguyen
(74) *Attorney, Agent, or Firm* — Suiter Swantz pc llo

(57) ABSTRACT

A scanning electron microscopy system for mitigating charging artifacts includes a scanning electron microscopy sub-system for acquiring multiple images from a sample. The images include one or more sets of complementary images. The one or more sets of complementary images include a first image acquired along a first scan direction and a second image acquired along a second scan direction opposite to the first scan direction. The system includes a controller communicatively coupled to the scanning electron microscopy sub-system. The controller is configured to receive images of the sample from the scanning electron microscopy sub-system. The controller is further configured to generate a composite image by combining the one or more sets of complementary images.

20 Claims, 5 Drawing Sheets

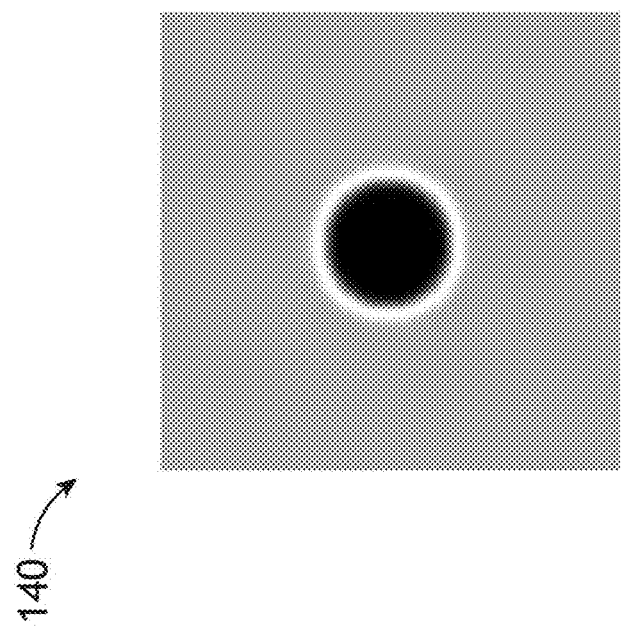
FIG.1C
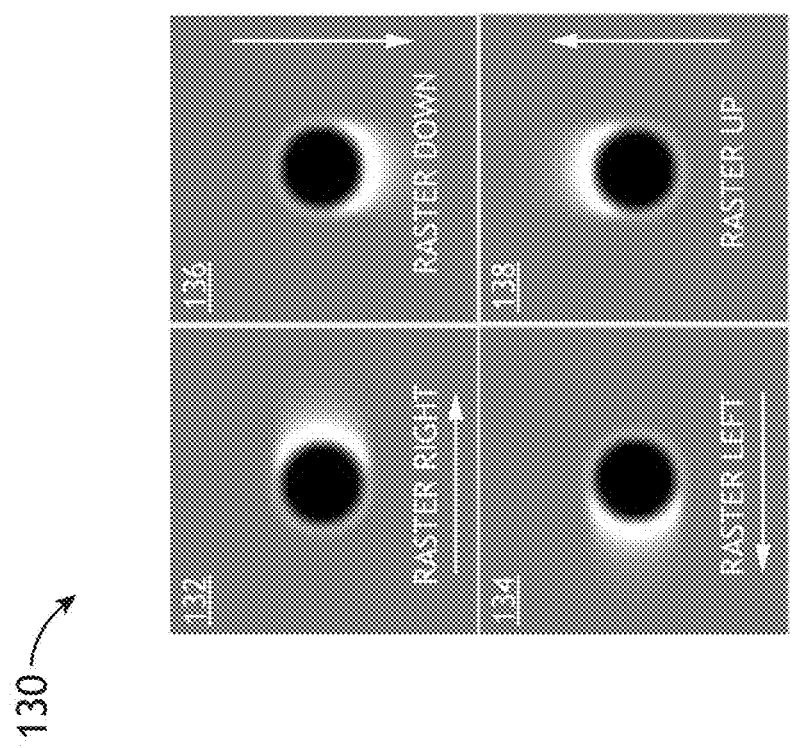
FIG.1B
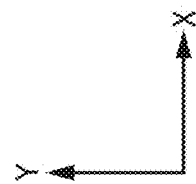

METHOD AND SYSTEM FOR REDUCING CHARGING ARTIFACTS IN SCANNING ELECTRON MICROSCOPY IMAGES

CROSS-REFERENCE TO RELATED APPLICATION

The present application claims benefit under 35 U.S.C. §119(e) and constitutes a regular (non-provisional) patent application of U.S. Provisional Application Ser. No. 62/127,599, filed Mar. 3, 2015, entitled SEM SCANNING METHOD, naming Chris Sears and Ben Clarke as inventors, which is incorporated herein by reference in the entirety.

TECHNICAL FIELD

The present invention generally relates to scanning electron microscopy, and, in particular, the removal of charging artifacts from scanning electron microscopy images.

BACKGROUND

Fabricating semiconductor devices such as logic and memory devices typically includes processing a substrate such as a semiconductor wafer using a large number of semiconductor fabrication processes to form various features and multiple levels of the semiconductor devices. As semiconductor device size become smaller and smaller, it becomes critical to develop enhanced inspection and review devices and procedures.

One such inspection technology includes scanning electron microscopy. Images obtained via scanning electron microscopy commonly suffer from dynamic charging artifacts, such as streaking and non-uniformity. The presence of charging artifacts in a given image reduces the quality and accuracy of the image. Typically, dynamic charging artifacts are mitigated by adjusting imaging conditions, landing energy or extraction field. In addition, dynamic charging artifacts are reduced by imaging in "back scatter" mode, avoiding the measurement of secondary electrons, the source of the dynamic charging effects. However, prior approaches to mitigating dynamic charging require trial and error to identify the optimal conditions of the given sample. Further, the optimization of conditions, necessary to minimize dynamic charging, often comprise a variety of image quality characteristics, such as resolution and detail of top/bottom surfaces As such, it would be advantageous to provide a system and method that provides reduced dynamic charging artifacts in scanning electron microscopy images so as to remedy the shortcomings of the conventional approaches identified above.

SUMMARY

A scanning electron microscopy system for providing images with reduced or eliminated charging artifacts is disclosed, in accordance with one or more illustrative embodiments of the present disclosure. In one embodiment, the system includes a scanning electron microscopy sub-system configured to acquire a plurality of images from a sample. In another embodiment, the plurality of images includes at least one set of complementary images including a first image acquired along a first scan direction and at least a second image acquired along a second scan direction opposite to the first scan direction. In another embodiment, at least one of the first image or the at least the second image include one or more charging artifacts. In another embodiment, the system includes a controller communicatively coupled to one or more portions of the scanning electron microscopy sub-system. In another embodiment, the controller includes one or more processors configured to execute program instructions configured to cause the one or more processors to receive the plurality of images of the sample from the scanning electron microscopy sub-system. In another embodiment, the controller includes one or more processors configured to execute program instructions configured to generate a composite image by combining the at least one complementary set of images including the first image acquired along the first scan direction and the at least the second image acquired along the second scan direction opposite to the first scan direction, wherein an intensity of one or more charging artifacts in the composite image is less than an intensity of one or more charging artifacts in at least one of the first image or the at least the second image.

A method for providing images with reduced or eliminated charging artifacts is disclosed, in accordance with one or more illustrative embodiments of the present disclosure. In one embodiment, the method includes acquiring a plurality of scanning electron microscopy images of a sample including at least one set of complementary images. In another embodiment, the at least one set of complementary images includes a first image acquired along a first scan direction and at least a second image acquired along a second scan direction opposite to the first scan direction. In another embodiment, at least one of the first image or the at least the second image include one or more charging artifacts. In another embodiment, the method includes generating a composite image by combining the at least one set of complementary images including the first image acquired along the first scan direction and the at least the second image acquired along the second scan direction opposite to the first scan direction. In another embodiment, an intensity of one or more charging artifacts in the composite image is less than an intensity of one or more charging artifacts in at least one of the first image or the at least the second image.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 1B depicts a set of images corresponding to four different scanning directions, in accordance with one embodiment of the present disclosure.

FIG. 1C depicts a reconstructed composite image with charging artifacts removed in accordance with one embodiment of the present disclosure.

DETAILED DESCRIPTION OF THE INVENTION

Reference will now be made in detail to the subject matter disclosed, which is illustrated in the accompanying drawings.

Figure 1A:
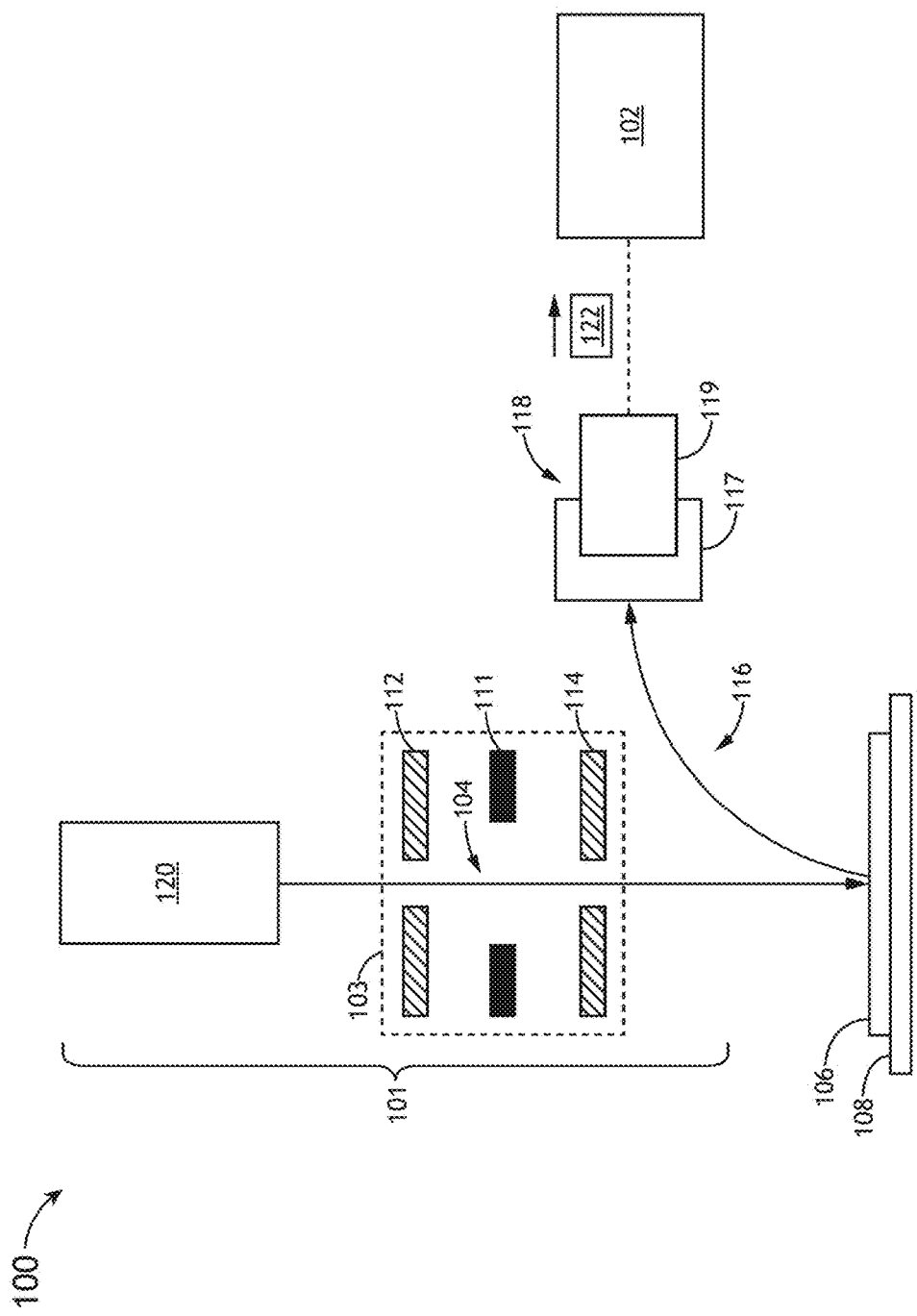
FIG. 1A is a high level schematic illustration of a scanning electron microscopy system for forming images with reduced charging artifacts, in accordance with one embodiment of the present disclosure.
Figure 1D:
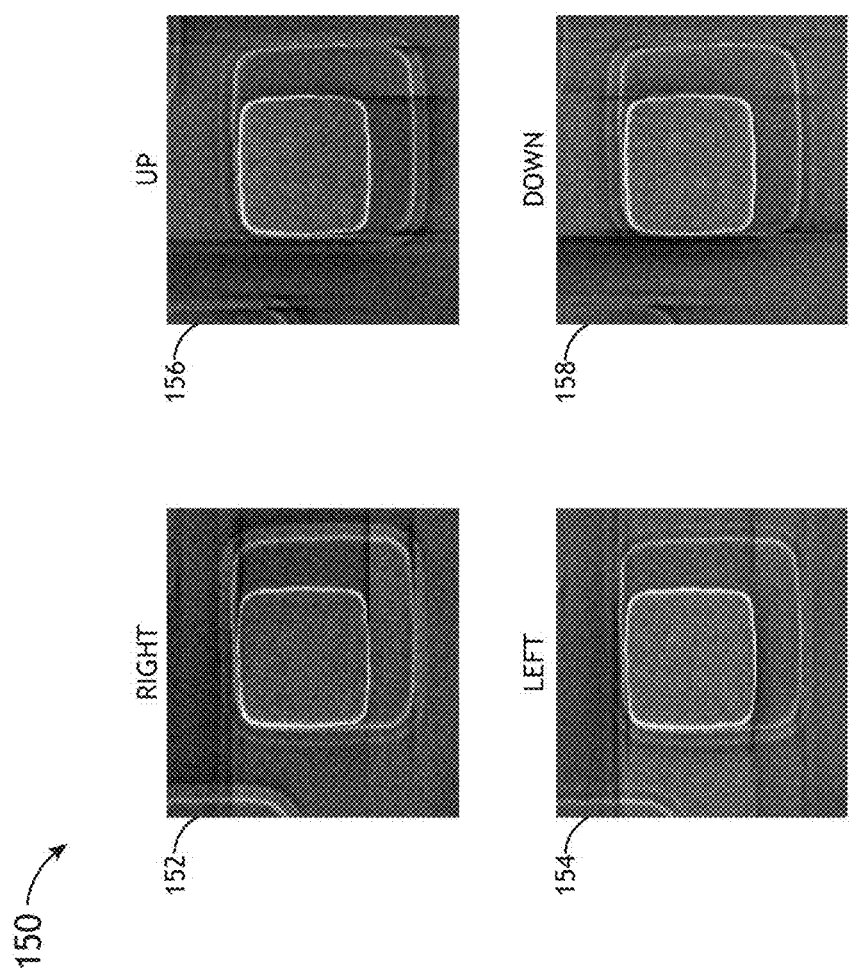
FIG. 1D depicts a set of images corresponding to four different scanning directions, in accordance with one embodiment of the present disclosure.
Figure 1E:
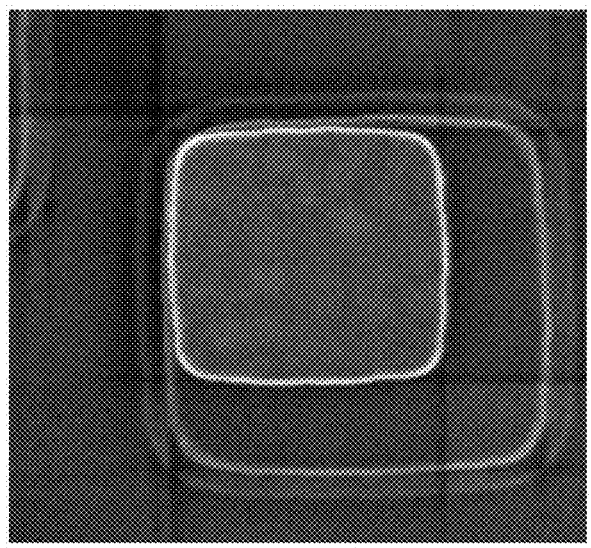
FIG. 1E depicts a simple composite image formed by the simple summation of four images, in accordance with one embodiment of the present disclosure.
Figure 1F:
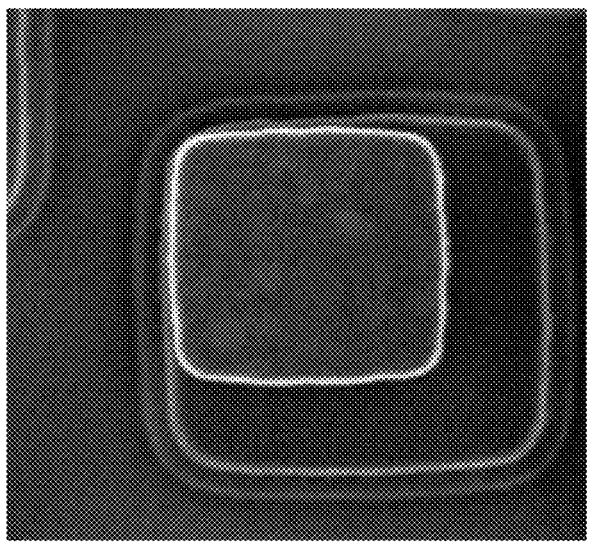
FIG. 1F depicts a reconstructed composite image formed by the combination of four images so as to eliminate charging effects in the composite image, in accordance with one embodiment of the present disclosure.
Figure 2:
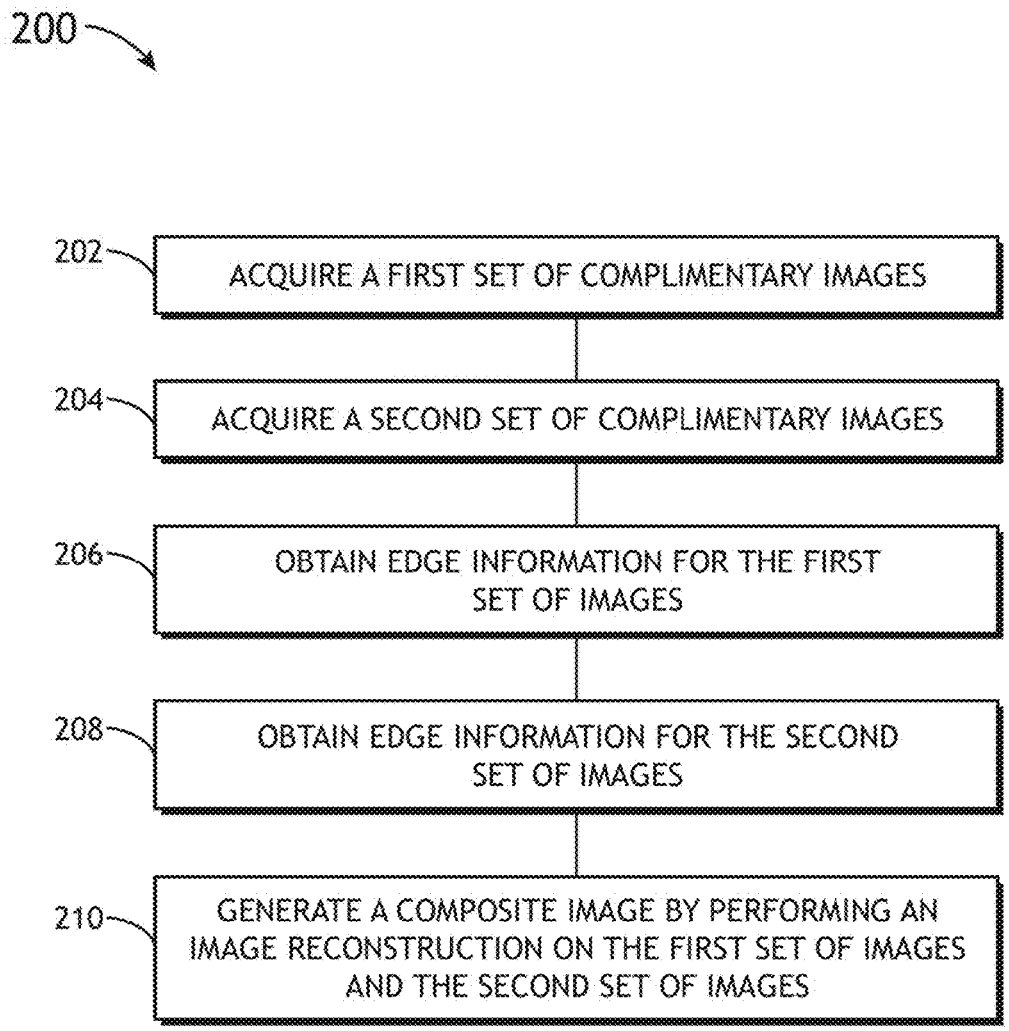
FIG. 2 is a process flow diagram illustrating a method for forming scanning electron microscopy images with reduced charging artifacts, in accordance with one embodiment of the present disclosure.

Referring generally to FIGS. 1A through 2, a system and method for providing scanning electron microscopy images with reduced charging artifacts is described in accordance with the present disclosure.

Embodiments of the present disclosure are directed to the acquisition of multiple scanning electron microscopy (SEM) images, whereby the scanning is carried out in different directions (e.g., right, left, down and/or up scans). Additional embodiments of the present disclosure are directed to combining the acquired images from different scan directions such that the portions of the original images related to dynamic charging (e.g., streaking, non-uniformity and etc.) are removed from the final image. In some embodiments, the final image is closer to the "true" nature of the given sample.

FIG. 1A illustrates system 100 for performing scanning electron microscopy (SEM) with reduced charging effects, in accordance with one embodiment of the present disclosure.

In one embodiment, the system 100 includes a SEM sub-system 101 and controller 102 communicatively coupled to the SEM sub-system 101.

In one embodiment, the SEM sub-system 101 scans one or more electron beams 104 across the sample and acquires multiple images 122 suffering from one or more charging artifacts from the sample 106. In one embodiment, at least some of the multiple images 122 are acquired along different scanning directions (e.g., left, right, up and/or down). In another embodiment, the acquired images include at least one set (e.g. pair) of complementary images. For example, each set of complementary images may include a first image acquired along a first scan direction and at least a second image acquired along a second scan direction that is different from (e.g., opposite to) the first scan direction. For instance, a set of complementary images may include, but is not limited to, a first image acquired via a "left" scanning process and a second image acquired via a "right" scanning process. By way of another example, a set of complementary images may include, but is not limited to, a first image acquired via an "up" scanning process and a second image acquired via "down" scanning process. It is noted herein that the terms left, right, up and down are used herein merely for convenience and should not be interpreted as a limitation on the present disclosure.

The SEM sub-system 101 may include any SEM tool or device known in the art of scanning electron microscopy suitable for scanning an electron beam 104 across a selected region of sample 106. In one embodiment, sample 106 includes, but is not limited to, a wafer (e.g., semiconductor wafer). The SEM sub-system 101 may operate in any scanning mode known in the art. For example, the SEM sub-system 101 may operate in a swathing mode when scanning an electron beam 104 across the surface of the sample 106. In this regard, the SEM sub-system 101 may scan an electron beam 104 across the sample 106, while the sample is moving. By way of another example, the SEM sub-system 101 may operate in a step-and-scan mode when scanning an electron beam 104 across the surface of the sample 106. In this regard, the SEM sub-system 101 may scan an electron beam 104 across the sample 106.

In one embodiment, the controller 102 includes one or more processors configured to execute program instructions stored in memory. The one or more program instructions are programmed so as to cause the one or more processors of the controller 102 to execute one or more steps described throughout the present disclosure.

In one embodiment, the controller 102 receives two or more images acquired along different scan directions (e.g., left, right, up, down). In one embodiment, the controller 102 receives one or more sets of complementary images of the sample 106 from the SEM sub-system 101. In another embodiment, the controller 102 generates a composite image by combining the one or more sets of complementary images. For example, the controller 102 may combine a first image acquired along the first scan direction (e.g., left scanning direction) and a second image acquired along the second scan direction (e.g., right scanning direction). The images of the sample 106 are combined such that the portions of the images related to dynamic charging (e.g., streaking, non-uniformity, and etc.) are removed from the composite image. In this sense, the presence (e.g., measured by intensity) of one or more charging artifacts in the composite image is less than that observed in the original SEM images.

In one embodiment, the controller 102 may receive a first and second set of complementary images. For example, a first set of complementary images may include a first image acquired along a first scan direction and a second image acquired along a second scan direction opposite to the first scan direction. Further, a second set of complementary images may include a first image acquired along a third scan direction and a second image acquired along a fourth scan direction opposite to the third scan direction (and perpendicular to the first and second scan directions).

For example, FIG. 1B illustrates a set of images 130 acquired with the SEM sub-system 101. As shown in FIG. 1B, the first set of complementary images may include, but is not limited to, a left scan image 132 and a left scan image 134. Further, the second set of complementary images may include, but is not limited to, a down scan image 136 and an up scan image 138.

The images 132-138 may then be combined to form the composite image 140, as shown in FIG. 1C. As shown in composite image 140, the charging artifacts present in images 132-138 have been removed or at least significantly reduced via the combination of images 132-138 by controller 102. In this regard, the controller 102 may identify the portions of the images associated with dynamic charging and combine the images 132-138 such that the charging artifacts are removed or reduced in the final composite image 140.

In one embodiment, the combination of images 132-138 may include acquiring edge information from the images 132-138. It is noted herein that a set of opposite scans may yield information for an inspected object along the edge perpendicular to the scan direction. For example, as shown in FIG. 1B, the right scan image 132 and the left scan image 134 (i.e., x-direction scans) provide information related to the edges running along the y-direction. Similarly, the down scan image 136 and the up scan image 138 (i.e., y-direction scans) provide information related to the edges running along the x-direction.

In one embodiment, the controller 102 may acquire edge information for the first set of complementary images via a first gradient map. For instance, in the case of left/right images 132, 134, the controller 102 may generate an x-direction gradient map (Gx). In another instance, in the case of down/up images 136, 138 the controller 102 may generate a y-direction gradient map (Gy). In this sense, scans obtained along opposite directions (e.g., left/right or down/up) may be used by controller 102 to form the gradient maps along the given scanning axis (e.g., x or y).

In another embodiment, the gradient maps Gx, Gy are formed by convolving the images with a derivative filter (e.g., 2 point or 3 point derivative filter) for each of the scan directions, and in each direction for a given scanning axis. In this sense, for each raster scan direction there may be two corresponding gradient maps, Gx and Gy. In this sense, scans obtained along opposite directions (e.g., left/right or down/up) may be used by controller 102 to form the gradient maps along the given scanning axis (e.g., x or y).

In another embodiment, after obtaining the complementary images 132/134 and 136/138 and generating the corresponding gradient maps Gx/Gy, the controller 102 may then generate the composite image 140. In one embodiment, the generation of the composite images includes an image reconstruction using the first set of complementary images 132/134, the second pair of complementary images 136/138 and the gradient maps, Gx and Gy. In this regard, the Gx and Gy gradient map may be used reconstruct the digital image along the x- and y-directions, so as to remove or reduce the presence of the charging artifacts present in right, left, down and up scans. Based on the image reconstruction carried out with the Gx and Gy gradient maps, the charging artifacts are removed or reduced in the final composite image 140. It is noted that the image reconstruction may be carried out using any image processing algorithms known in the art including, but not limited to, a Poisson minimization algorithm, a Frank-Chellapa algorithm and etc.

It is noted that, while the embodiments described herein, have focused on the combination of four images from four directions (right, left, up and down) this is not a limitation on the present disclosure. It is noted that the present disclosure may be extended to any number of different scan orientations, such as, but not limited to, 2, 3 or 4 scan orientations. Further, it is recognized that the present disclosure may be extended to the case including more than four scan directions. In this sense, the present disclosure may be extended to the case where a multitude (e.g., greater than four) of scan orientations are used to acquire the SEM images.

Referring to FIGS. 1D and 1E, a summation of images may be used to identify boundary conditions for use in the image reconstruction during the formation of the composite image. For example, as shown in FIG. 1D, a right scan image 152, a left scan image 154, an up scan image 156 and a down scan image 158 may be acquired by the SEM sub-system 101 and received by controller 102. In another embodiment, images 152, 154, 156 and 158 may be combined in a simple image addition process to form the simple sum image 160 of FIG. 1E. It is noted that image 160 shows an aggregation of all the charging artifacts that were individually present in scan images 152, 154, 156 and 158. Based on the simple sum image 160, the controller 102 may acquire one or more boundary conditions for use in forming the composite image 170 via the image reconstruction using gradient maps Gx and Gy.

Referring again to FIG. 1A, in one embodiment, the SEM sub-system 101 includes an electron beam source 120 for generating one or more electron beams 104. The electron beam source 120 may include any electron source known in the art. For example, the electron beam source 120 may include, but is not limited to, one or more electron guns. For instance, the electron beam source 120 may include a single electron gun for generating a single electron beam 104. In another instance, the electron beam source 120 may include multiple electron guns for generating multiple electron beams 104. In another embodiment, the SEM sub-system 101 includes a sample stage 108. The sample stage 108 secures the sample 108 (e.g., semiconductor wafer). In another embodiment, the sample stage 106 is an adjustable stage. For example, the sample stage 108 may include, but is not limited to, one or more translational stages suitable for selectably translating the sample 106 along one or more linear directions (e.g., x-direction, y-direction and/or z-direction). By way of another example, the sample stage 108 may include, but is not limited to, one or more rotational stages suitable for selectably rotating the sample 106 along a rotational direction. By way of another example, the sample stage 108 may include, but is not limited to, a rotational stage and a translational stage suitable for selectably translating the sample along a linear direction and/or rotating the sample 106 along a rotational direction.

In another embodiment, the SEM sub-system 101 includes an electron-optical column 103. The electron-optical column 103 may include a set of electron-optical elements. The set of electron-optical elements may direct at least a portion of the electron beam 104 onto a selected portion of the sample 106. The set of electron-optical elements of the electron-optical column 103 may include any electron-optical elements known in the art suitable for focusing and/or directing the electron beam 104 onto a selected portion of the sample 106. In one embodiment, the set of electron-optical elements includes one or more electron-optical lenses. For example, the electron-optical lenses may include, but are not limited to, one or more condenser lenses 112 for collecting electrons from the electron beam source 120. By way of another example, the electron-optical lenses may include, but are not limited to, one or more objective lenses 114 for focusing the electron beam 104 onto a selected region of the sample 106.

In another embodiment, the set of electron-optical elements of the electron-optical column 103 includes one or more electron beam scanning elements 111. For example, the one or more electron beam scanning elements 111 may include, but are not limited to, one or more electromagnetic scanning coils or electrostatic deflectors suitable for controlling a position of the beam 104 relative to the surface of the sample 106. In this regard, the one or more scanning elements 111 may be utilized to scan the electron beam 104 across the sample 106 in a selected pattern.

For purposes of simplicity a single electron-optical column 103 is depicted in FIG. 1A. It is noted herein that this configuration should not be interpreted as a limitation the present disclosure. For example, the SEM sub-system 101 may include multiple electron-optical columns 103.

In one embodiment, the SEM sub-system 101 includes one or more detector assemblies. In one embodiment, the SEM sub-system 101 includes a secondary electron detector assembly 118. The secondary electron detector assembly 118 may include any detector technology known in the art capable of detecting secondary electrons. For example, as shown in FIG. 1A, the secondary electron detector assembly 118 may include, but is not limited to, an Everhart-Thornley detector. For instance, the detector assembly 118 may include an electron collector 117 (e.g., secondary electron collector), which may be biased to collect secondary electrons 116 emitted by the surface of the sample 106. Further, the detector assembly 118 includes a detector element 119 (e.g., scintillating element and light detector (e.g., PMT or CCD)) for detecting electrons 116 from the sample surface. By way of another example, although not shown, the secondary electron detector assembly 118 may be configured as an in-column detector. For instance, the detector assembly 118 may include a secondary electron detector disposed within the electron-optical column 103.

In another embodiment, the controller 102 may adjust one or more parameters of the SEM sub-system 101 based on the composite image. For example, based on the results shown in the generated composite image, the controller 102 may adjust any one of the various scanning or image forming parameters of the SEM sub-system 101. In another embodiment, the controller 102 may adjust one or more process tools communicatively coupled to the controller 102 based on the composite image. For example, the controller 102 may provide feedback or feedforward information to one or more process tools communicatively coupled to controller 102.

The one or more processors of controller 102 may include any processing element known in the art. In this sense, the one or more processors may include any microprocessor-type device configured to execute program instructions. In one embodiment, the one or more processors 102 may consist of a desktop computer, mainframe computer system, workstation, image computer, parallel processor, or any other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium, or memory. Moreover, different subsystems of the system 100 may include processor or logic elements suitable for carrying out at least a portion of the steps described throughout the present disclosure. Therefore, the above description should not be interpreted as a limitation on the present invention but merely an illustration.

The memory of controller 102 may include any storage medium known in the art suitable for storing program instructions executable by the associated one or more processors. For example, the memory may include a non-transitory memory medium. For instance, the memory may include, but is not limited to, a read-only memory, a random access memory, a magnetic or optical memory device (e.g., disk), a magnetic tape, a solid state drive and the like. In another embodiment, it is noted herein that the memory is configured to store one or more results from the SEM sub-system 101 and/or the output of one or more of the various steps described herein. It is further noted that memory may be housed in a common controller housing with the one or more processors. In an alternative embodiment, the memory may be located remotely with respect to the physical location of the one or more processors and controller 102. For instance, the one or more processors of controller 102 may access a remote memory (e.g., server), accessible through a network (e.g., internet, intranet and the like).

The embodiments of the system 100 illustrated may be further configured as described herein. In addition, the system 100 may be configured to perform any other step(s) of any of the method embodiment(s) described herein.

FIG. 2 is a flow diagram illustrating steps performed in a method 200 for providing scanning electron microscopy images with reduced charging artifacts. It is recognized that steps of the process flow 200 may be carried out via one or more embodiments of system 100. It should, however, be recognized by those skilled in the art, that the system 100 should not be interpreted as a limitation on process 200 as it is contemplated that a variety of system configurations may carry out process flow 200.

In step 202, a first set of complementary images is acquired. For example, as shown in FIGS. 1A-1B, a first set of images 132, 134 may be acquired via SEM sub-system 101. For instance, the second set of images may include a right scan image 132 (e.g., raster right scan) and a left scan image 134 (e.g., raster left scan).

In step 204, a second set of complementary images is acquired. For example, as shown in FIGS. 1A-1B, a second set of images 136, 138 may be acquired via SEM sub-system 101. For instance, the first set of images may include a down scan image 136 (e.g., raster down scan) and an up scan image 138 (e.g., raster up scan).

In step 206, edge information for the first set of images complementary images is obtained. For example, controller 102 may obtain edge information associated with the set of complementary images 132, 134 via a first gradient map. For instance, in the case where the images include a right scan image 132 and a left scan image 134, the controller 102 may obtain edge information by forming a gradient map Gx along the x-direction.

In step 208, edge information for the second set of complementary images is obtained. For example, controller 102 may obtain edge information associated with the set of complementary images 136, 138 via a second gradient map. For instance, in the case where the images include a down scan image 136 and an up scan image 138, the controller 102 may obtain edge information by forming a gradient map Gy along the y-direction.

In step 210, a composite image is generated. For example, controller 102 may generate a composite image by performing an image reconstruction on the first set of complementary images and the second set of complementary images. For instance, a composite image 140 may be formed by performing an image reconstruction on the first set of images 132, 134 and the second set of images 136, 138 using the first gradient map Gx and the second gradient map Gy.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and/or firmware.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A scanning electron microscopy apparatus comprising:
   a scanning electron microscopy sub-system configured to acquire a plurality of images from a sample, wherein the plurality of images includes at least one set of complementary images including a first image acquired along a first scan direction and at least a second image acquired along a second scan direction opposite to the first scan direction, wherein at least one of the first image or the at least the second image include one or more charging artifacts; and
   a controller communicatively coupled to one or more portions of the scanning electron microscopy sub-system, the controller including one or more processors configured to execute program instructions configured to cause the one or more processors to:
   receive the plurality of images of the sample from the scanning electron microscopy sub-system; and
   generate a composite image by combining the at least one complementary set of images including the first image acquired along the first scan direction and the at least the second image acquired along the second scan direction opposite to the first scan direction, wherein an intensity of one or more charging artifacts in the composite image is less than an intensity of one or more charging artifacts in at least one of the first image or the at least the second image.

2. The apparatus of claim 1, wherein the scanning electron microscopy sub-system comprises:
   an electron beam source configured to generate one or more electron beams;
   a sample stage configured to secure the sample;
   a set of electron-optic elements configured to direct the one or more electron beams onto the sample; and
   a detector assembly configured to detect electrons from the surface of the sample.

3. The apparatus of claim 2, wherein the electron beam source includes one or more electron guns.

4. The apparatus of claim 2, wherein the electron beam source is configured to generate a single electron beam.

5. The apparatus of claim 2, wherein the electron beam source is configured to generate two or more electron beams.

6. The apparatus of claim 2, wherein the sample stage comprises:
   at least one of a linear sample stage and a rotational sample stage.

7. The apparatus of claim 2, wherein the detector assembly comprises:
   a collector;
   a scintillating element; and
   a light detector.

8. The apparatus of claim 1, wherein the scanning electron microscopy sub-system is configured to inspect a surface of one or more semiconductor wafers.

9. The apparatus of claim 1, wherein the scanning electron microscopy sub-system is configured to perform a raster scanning process on the sample.

10. The apparatus of claim 1, wherein the at least one set of complementary images including a first image acquired along a first scan direction and at least a second image acquired along a second scan direction opposite to the first scan direction comprises:
    a first set of complementary images, wherein a first image of the first set of complementary images is acquired along a first scan direction, wherein a second image of the first set of complementary images is acquired along a second scan direction opposite to the first scan direction; and
    a second set of complementary images, wherein a first image of the second set of complementary images is acquired along a third scan direction, wherein a second image of the second set of complementary images is acquired along a fourth scan direction opposite to the third scan direction.

11. The apparatus of claim 10, wherein the generation of the composite image by combining the at least one complementary set of images comprises:
    acquiring edge information for the first set of complementary images via a first gradient map;
    acquiring edge information for the second set of complementary images via a second gradient map; and
    generating the composite image by performing an image reconstruction on the first set of complementary images and the second set of complementary images with the first gradient map and the second gradient map.

12. The apparatus of claim 11, wherein the controller is further configured to determine one or more boundary conditions for generating the composite image by performing an image summation of the first set of complementary images and the second set of complementary images.

13. The apparatus of claim 1, wherein the controller is further configured to:
    adjust one or more parameters of the scanning electron microscopy sub-system based on the composite image.

14. The apparatus of claim 1, wherein the controller is further configured to:
    adjust one or more process tools communicatively coupled to the controller based on the composite image.

15. A method comprising:
    acquiring a plurality of scanning electron microscopy images of a sample including at least one set of complementary images, wherein the at least one set of complementary images includes a first image acquired along a first scan direction and at least a second image acquired along a second scan direction opposite to the first scan direction, wherein at least one of the first image or the at least the second image include one or more charging artifacts; and
    generating a composite image by combining the at least one set of complementary images including the first image acquired along the first scan direction and the at least the second image acquired along the second scan direction opposite to the first scan direction, wherein an intensity of one or more charging artifacts in the composite image is less than an intensity of one or more charging artifacts in at least one of the first image or the at least the second image.

16. The method of claim 15, wherein the acquiring a plurality of scanning electron microscopy images of a sample including at least one set of complementary images comprises:

acquiring a first set of complementary images, wherein a first image of the first set of complementary images is acquired along a first scan direction, wherein a second image of the first set of complementary images is acquired along a second scan direction opposite to the first scan direction; and acquiring a second set of complementary images, wherein a first image of the second set of complementary images is acquired along a third scan direction, wherein a second image of the second set of complementary images is acquired along a fourth scan direction opposite to the third scan direction.

17. The method of claim 16, wherein the generating a composite image by combining the at least one set of complementary images comprises:

acquiring edge information for the first set of complementary images via a first gradient map;

acquiring edge information for the second set of complementary images via a second gradient map; and generating the composite image by performing an image reconstruction on the first set of complementary images and the second set of complementary images with the first gradient map and the second gradient map.

18. The method of claim 17, further comprising:
determining one or more boundary conditions for generating the composite image by performing an image summation of the first set of complementary images and the second set of complementary images.

19. The method of claim 15, further comprising:
adjusting one or more parameters of a scanning electron microscopy sub-system based on the composite image.

20. The method of claim 15, further comprising:
adjusting one or more process tools communicatively coupled to a controller based on the generated composite image.

* * * * *